(12) United States Patent
Bennett, Sr.

(10) Patent No.: US 6,334,745 B1
(45) Date of Patent: Jan. 1, 2002

(54) APPARATUS AND METHOD FOR WORKING DOUBLE SIDED WORKPIECE

(76) Inventor: Timothy J. Bennett, Sr., 6646 Royal Oak Ct., Tucker, GA (US) 30084

( * ) Notice: Subject to any disclaimer, the term of this patent is extended or adjusted under 35 U.S.C. 154(b) by 0 days.

(21) Appl. No.: 09/351,371

(22) Filed: Jul. 12, 1999

(51) Int. Cl.⁷ .............................. B23C 3/00; B23C 1/04; B23B 35/00; B23B 39/22

(52) U.S. Cl. ...................... 409/132; 409/189; 409/191; 409/203; 409/237; 408/37; 408/52; 408/88; 408/91; 408/1 R

(58) Field of Search .............................. 408/42, 53, 20, 408/87–88, 103, 108, 235, 236, 36, 37, 52, 91, 1 R; 409/132, 144, 203, 235, 237, 189–191

(56) References Cited

U.S. PATENT DOCUMENTS

| | | | |
|---|---|---|---|
| 1,132,534 A | * 3/1915 | De Leeuw | 409/206 |
| 2,268,930 A | * 1/1942 | Edwards | 77/62 |
| 2,416,912 A | * 3/1947 | Curtis | 408/103 |
| 3,557,442 A | * 1/1971 | Speller | 29/525.06 |
| 3,914,871 A | * 10/1975 | Wolff | 331/174 |
| 4,215,958 A | * 8/1980 | Jagers | 408/38 |
| 4,447,178 A | * 5/1984 | Esser | 408/235 |
| 4,484,844 A | * 11/1984 | Williams | 408/82 |
| 4,786,216 A | * 11/1988 | Kitagawa et al. | 408/87 |
| 4,966,323 A | * 10/1990 | Speller, Sr. et al. | 227/51 |
| 4,967,947 A | * 11/1990 | Sarh | 227/52 |
| 5,152,641 A | * 10/1992 | Overmyer et al. | 408/1 R |
| 5,213,454 A | * 5/1993 | Givler et al. | 408/61 |
| 5,404,641 A | * 4/1995 | Bratten et al. | 408/87 |
| 5,448,819 A | * 9/1995 | Grassi | 29/558 |
| 5,462,512 A | * 10/1995 | Hiroshima et al. | 483/57 |
| 5,921,729 A | * 7/1999 | Kikuchi et al. | 409/138 |

FOREIGN PATENT DOCUMENTS

| | | | | |
|---|---|---|---|---|
| DE | 1803989 B | * | 10/1968 | |
| DE | 3638350 | * | 5/1988 | 408/87 |
| DE | 3838246 A1 | * | 5/1990 | |
| DE | 19748289 A1 | * | 12/1998 | |
| FR | 539898 | * | 7/1955 | 408/235 |

* cited by examiner

Primary Examiner—A. L. Wellington
Assistant Examiner—Erica E Cadugan

(57) ABSTRACT

An apparatus for working on both sides of a flat workpiece includes a first support surface having a first axial line thereacross, a second support surface juxtaposed to and associated with the first support surface and having a second axial line thereacross which lies in a common plane with the first axial line, and a first carrying assembly operably connected to the first support surface in a manner to movably reciprocate along the first axial line and having a first extending arm which is laterally displaced from one side of the common plane and a second extending arm which is laterally displaced from another side of the common plane. A second carrying assembly is operably connected to the second support surface in a manner to movably reciprocate along the second axial line, wherein the second carrying assembly includes a workpiece removably mounted in a manner to position the workpiece in the common plane between the arms such that the arms extend about the workpiece. A tool is removably operably connected to either of the extending arms in a manner to permit the tool to perform work on a face of the workpiece.

57 Claims, 9 Drawing Sheets

APPARATUS AND METHOD FOR WORKING DOUBLE SIDED WORKPIECE

BACKGROUND

1. Field of Invention

This invention provides a method and apparatus for working on both sides of a flat workpiece such as a double sided printed circuit board (called hereinafter PCB) while maintaining high relative precision between sides.

2. Description of Prior Art

Various machines for drilling, engraving, and otherwise working flat stock such as a copper clad PCB substrate have been described, built and marketed in the past. Such machines are widely used for the production of PCBs in limited prototype quantities. They have the advantage of fast production turn-around and require no processing chemicals.

Such machines are typically equipped with a working table and are frequently referred to as flatbed machines. Flatbed machines generally have a machining tool mounted to a spindle motor disposed above and perpendicular to the plane of the table. The tool is caused to traverse is about the bed by the use of X-axis and Y-axis driving apparatuses while the rotating tool is engaged or disengaged to the workpiece as defined by the controlling software. Such a machine is proposed in patent 5,462,512 to Hirioshima (1995). However, this machine has no provision for working a double-sided workpiece.

An alternative to the flatbed machine has been a design employing a rigid U-shaped frame which straddles the flat workpiece. On the end of one arm of the U-frame would be disposed a backup supporting surface. On the other arm would be disposed a spindle motor holding a machining tool perpendicular to the plane of the workpiece and facing the backup supporting surface. The spindle motor would be moveable towards or away from the workpiece surface by use of a z-axis solenoid or motor for the purpose of engaging the working end of the tool into the workpiece according to a depth defined by computer software or by manual settings. When engaged, the tool would apply pressure to the workpiece which, in turn, would be thrust against the backup surface. The workpiece would then be caused to traverse in its plane as the Z-axis machining tool is engaged or disengaged according to the controlling software specifications. Such a machine is proposed in patent 4,786,216 to Kitagawa et al (1988) for a drilling machine. This machine has no provision for working a double-sided workpiece.

Other drilling machines having U-shaped arms have been proposed which have opposing spindle heads but no provision to cause the heads to traverse over the plane of workpiece by a programmable device or calibrated manual positioners. Machines of this description include U.S. Pat. No. 4,215,958 to Jagers (1980) and U.S. Pat. No. 5,152,641 to Overmyer and Peitz, JR. (1962).

Patent 4,967,947 to Sarh (1990) claims, "in effect", to have a C-frame configuration but the C-frame consists of three members having the two arms being independently slidable on the base, which would negate a prime advantage of my patent. This reference also provides for opposing detachable companionate tools, however it is limited to having a fixedly supported workpiece, has no provisions for engraving, and is a much more complex design than my patent.

In order to work both surfaces of a flat a workpiece it has been necessary to first place the workpiece over alignment pins on the machine surface such that the obverse workpiece surface faces the working end of a rotating machine tool. After the obverse surface was completely drilled and engraved, the workpiece would be flipped and again fitted over the alignment pins such that the inverse surface would face the machining tool and the engraving process would then continue to completion.

However, the flipping process created a number of problems. A major problem was an inability to obtain close overall alignment of related machined items on opposing surfaces of the workpiece. An obvious manifestation of this problem would be annular rings engraved on the inverse-side being misaligned with through-holes drilled from the obverse-side surface of a PCB.

Following is a list of some reasons that misalignment can not be eliminated when a workpiece is flipped in order to machine both sides:

The x-axis rails can not be adjusted perfectly perpendicular to the y-axis rails.

The X or Y-axis rails could not be set perfectly parallel or perpendicular to the workpiece pinning groove machined into the bed.

There may be irregularities in the pitch of the lead-screws.

The alignment pins may not be tight or may vibrate loose.

Pinning holes can not be drilled through the workpiece perfectly perpendicular to its plane.

Pins can not be set into the bed/table top perfectly perpendicular to the surface.

The rails can not be manufactured or installed perfectly straight.

Lead-screw wobble affects tool head position.

There could be imperfections in the axis driving motors.

Thermal expansion in lead-screws affects pitch.

None of the above listed reasons would necessarily be objectionable when machining only one surface of a workpiece. However, after being flipped, all the machined imperfections that were created on the workpiece from one table side of the alignment pins would now be associated with the table side opposite the alignment pins. The two machine-sides have totally different and sometimes additive imperfections. Compromise in machine alignment has been necessary in order to achieve overall acceptable double sided accuracy.

Other problems are as follows:

Obtaining acceptable overall alignment during machine manufacture has required many man-hours of highly skilled technical labor.

The larger the workpiece capacity the more difficult it has been to achieve overall machine calibration.

Machines are easily knocked out of alignment during shipping, handling, and normal wear and tear.

The table surface constitutes a considerable cost and weight percentage of a completed machine.

Debris from machining processes tends to settle on the working surface of flatbed machines.

Depth-of-cut is affected when the pressure foot "rides up" on the debris.

Horizontally positioned flat-bed machines require a considerable amount of table-top space.

Workpiece warpage can cause the machine tool to drag on the work surface during "tool-up" moves. This can damage tools and create defects in the work-in-progress.

In addition to pinning the workpiece to the table, taping of the workpiece to the platen is usually required to assure the edges are held down close to the surface and no workpiece movement occurs during engraving.

The workpiece flipping process is time consuming.

On flatbed machines a sheet of backup material equivalent in size to the blank workpiece is required to prevent drilling through the platen surface and to prevent substrate breakout as the drill bit penetrates the bottom surface.

Even though very few holes may have been drilled into the backup material, it can not be reused because of the possibility of a drill bit in the new work stiking a hole from previous work, causing bit breakage or otherwise causing poor quality drilling. Thus, a substantial amount of once-used and substantially unpenetrated backup material is frequently discarded.

Previous machines, having permanently mounted tool heads, require the tool head to be positioned off the edge of the platen surface in order to replace or flip the workpiece or change milling tools and drill bits. This off-board positioning process consumes production time and requires longer rails and lead screws than would be necessary to traverse the bed surface only.

Software and operating procedures are complicated when board flipping is required. A software mirror-image must be created for the flip side which, in turn, must be centered precisely relative to the obverse side. Making multiple small double sided PCB's on one substrate sheet is further complicated because of the need to offset individual works-in-progress on alternate machine sides. Electrical cable routing to the spindle head of a flatbed design can be complicated by the fact that the head must traverse in both the X and Y axis. Fixed head machines are limited to the head type installed during manufacture of the machine. Additional head options such as a fluid dispensing head must be adapted to the existing head, rendering a more complex overall design.

On flatbed machines, the back side of the work-in-progress cannot be visually monitored, mechanically sensed, or electrically sensed because of the obstacle presented by the bed itself. For example, without first removing the workpiece, it would be difficult to determine whether or not a drill bit is completely penetrating the workpiece.

Boring individual holes from both sides of a workpiece (rather than completely through from one side) in order to prevent material breakout resulted in tool breakage because of flipping misalignment.

Presently, physical design of electronic assemblies requires closer tolerances than ever before and future designs will even be more critical as component dimensions continue to decrease in order to increase component densities and decrease electrical losses. The ability of current apparatus to machine close tolerances into double sided flat work pieces is limited, in large part, because of the need to flip the workpiece in order to access both sides.

SUMMARY OF THE INVENTION

Accordingly, several advantages of the present invention are:

to provide an apparatus having the ability to work both sides of a flat workpiece without having to reposition or flip the workpiece within its mounting;

to provide greatly improved relative work precision between opposite workpiece sides;

to enable improved machine alignment stability;

to enable a simplified machine alignment process;

to enable simplified software applications;

to enable simplified operating procedures;

to enable easy access of tool chuck for tool replacement;

to enable user mounting of heads having different functions;

to enable user replacement of defective heads;

to enable use of a small floating backup support surface rather than a precision machined flatbed table, thus:

eliminating associated precision alignment pinning groove in bed;

eliminating need to drill pinning alignment holes through workpiece;

significantly reducing overall weight;

reducing manufacturing material cost, reducing manufacturing labor time;

enabling warped areas of workpiece to make intimate contact with backup support, enhancing control of depth-of-cut, and reducing disengaged tool drag and;

enabling use of small piece of backup material rather than full sheet as required for flatbed machines. Note: backup material is placed between workpiece and backup support surface or flatbed table to receive tip of drill bit as it completes workpiece penetration.

to enable the workpiece to be positioned vertically or at angle relative to support surface thus:

saving tabletop work space;

enabling workpiece angle to be regulated and hence controlling gravity pressure of substrate against backup surface;

enabling gravity to remove working debris from work surface and;

enabling visual, optical or electromechanical monitoring of work-in-progress from either workpiece side.

It is therefore an object of the present invention to provide a machine capable of precisely, speedily, and completely working both sides of a flat workpiece without having to reposition or flip the workpiece within its mounting.

According to the present invention, the forgoing and other objects can be achieved by providing an apparatus for working on both sides of a flat workpiece, which comprises:

a first support surface having a first axial line thereacross;

a second support surface juxtaposed to and associated with the first support surface and having a second axial line thereacross which lies in a common plane with the first axial line;

a first carrying assembly operably connected to the first support surface in a manner to movably reciprocate along the first axial line and having a first extending arm which is laterally displaced from one side of the common plane and a second extending arm which is laterally displaced from an opposing side of the common plane;

a second carrying assembly operably connected to the second support surface in a manner to movably reciprocate along the second axial line, wherein the second carrying assembly includes means for removably mounting the workpiece in a manner to position the workpiece in the common plane between the arms which extend about the workpiece; and a tool removably operably connected to one of the extending arms in a manner to permit the tool to perform work on a face of the workpiece.

The method includes movably disposing the flat workpiece in a predetermined plane such that the flat workpiece is movably positionably maintained within the plane; and actuating a pair is of arms about the plane such that the arms are positionably maintained at a predetermined distance from the workpiece, wherein each arm has tool means for working a respective facing side of the workpiece and the tool means are actuatable to act on common coordinate locations of the respective facing sides.

DETAILED DESCRIPTION OF THE PREFERRED EMBODIMENT

Figure 3A:
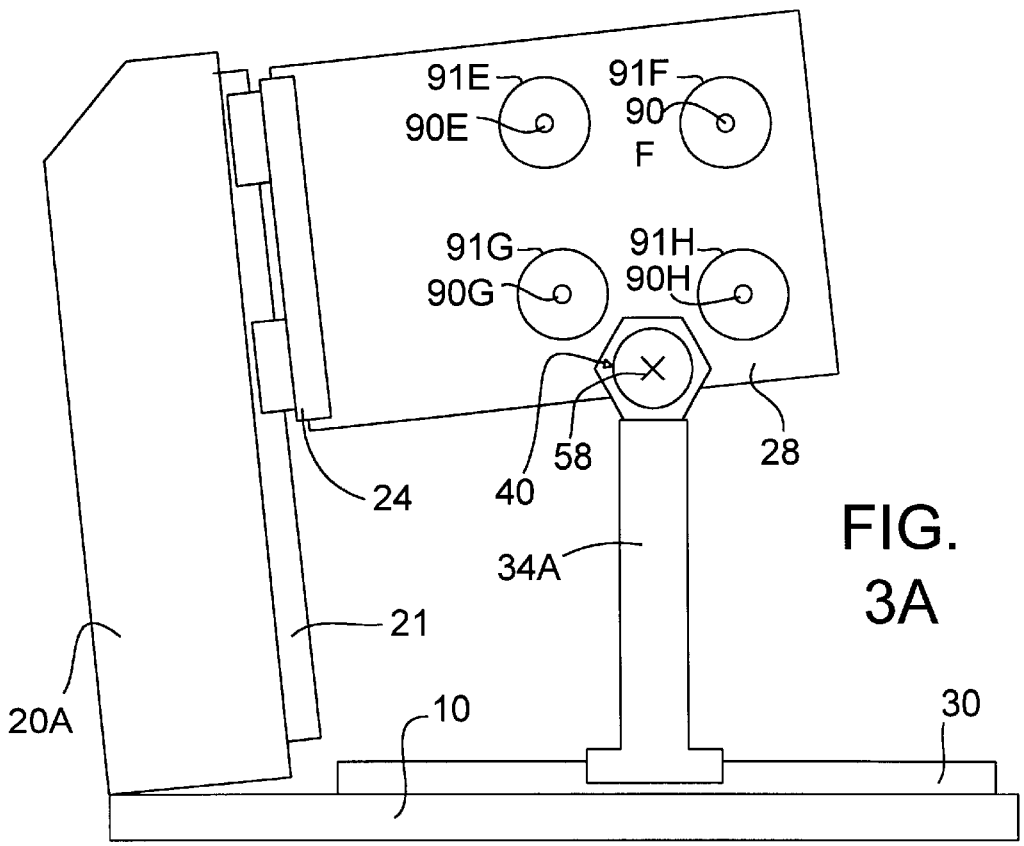
FIG. 3A illustrates a side view of the preferred embodiment which has been similarly misaligned.
Figure 3B:
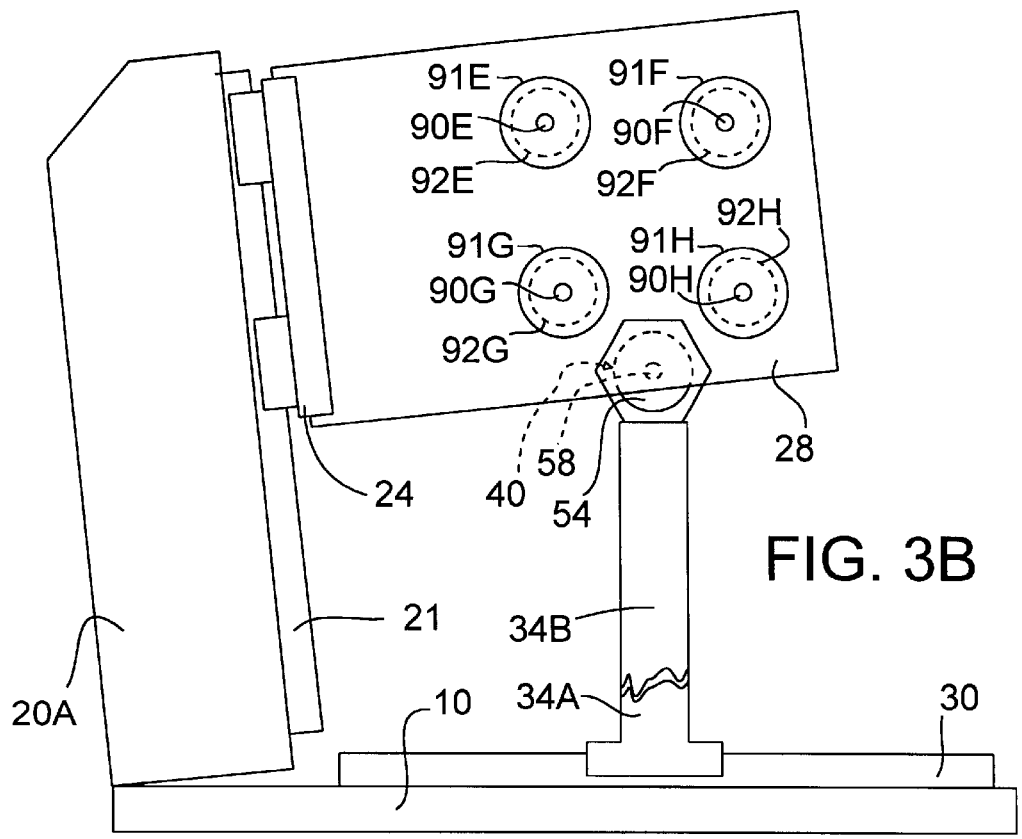
FIG. 3B illustrates a side view of the embodiment shown in FIG. 3A compensating for the misaligned.
Figure 5:
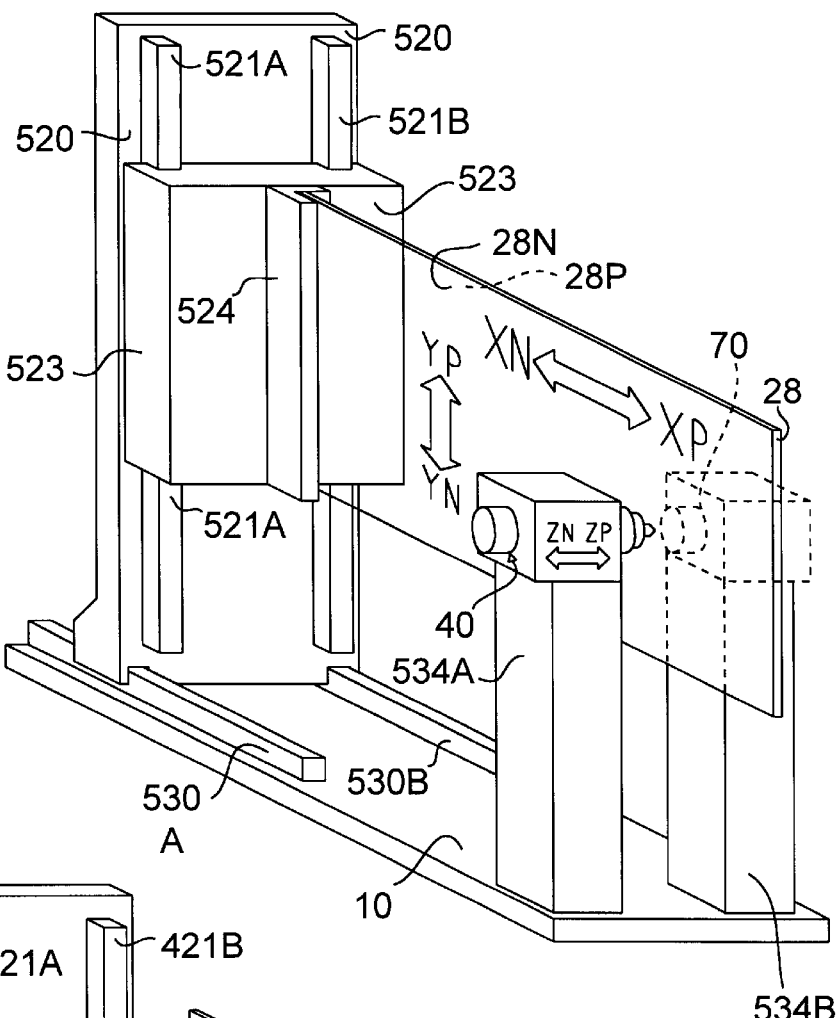
FIG. 5 is a variation of the invention having positionally fixed tools.
Figure 4:
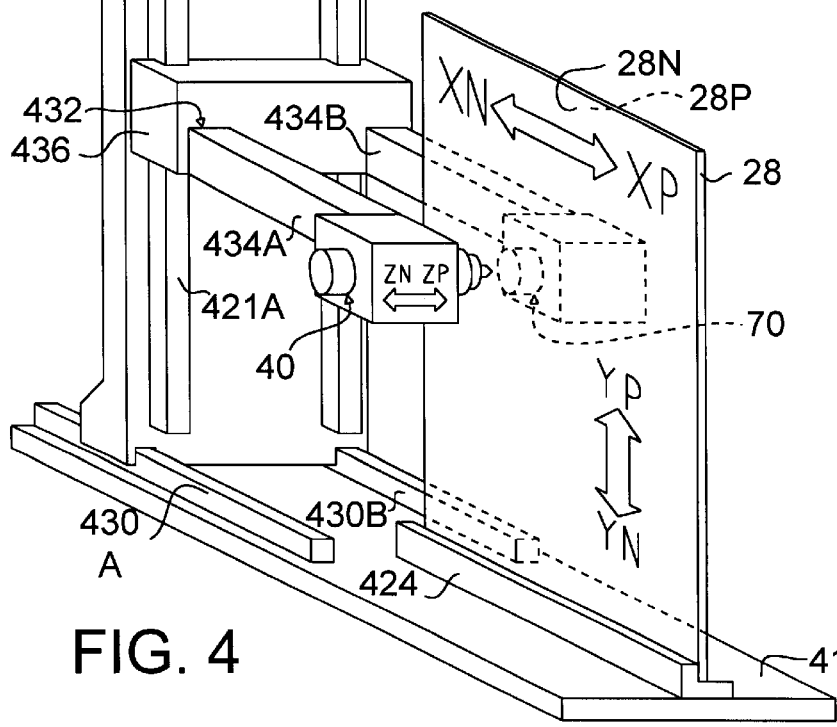
FIG. 4 is a variation of the invention having positionally fixed workpiece.
Figure 6:
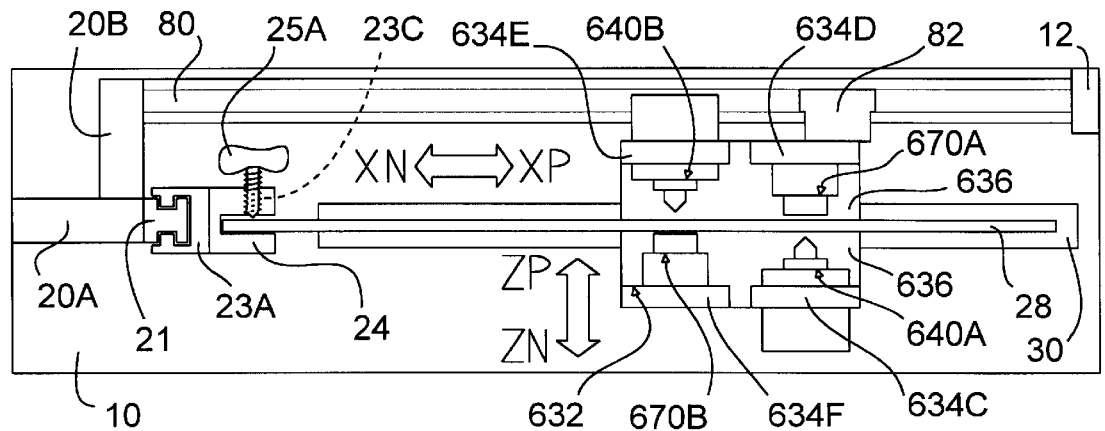
FIG. 6 is a top perspective variation having two pairs of heads.
Figure 7:
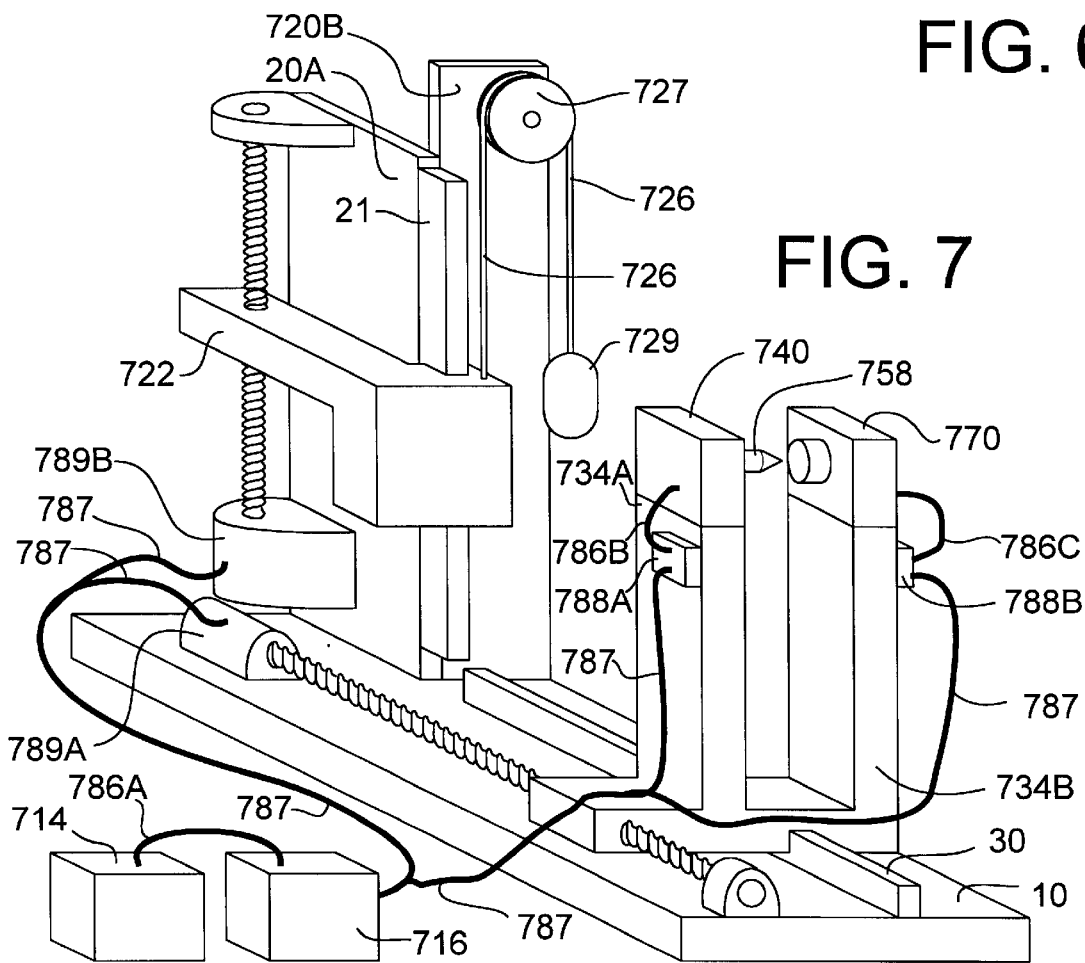
FIG. 7 illustrates a computer controller variation of the invention and a vertical counterbalance.
Figure 8:
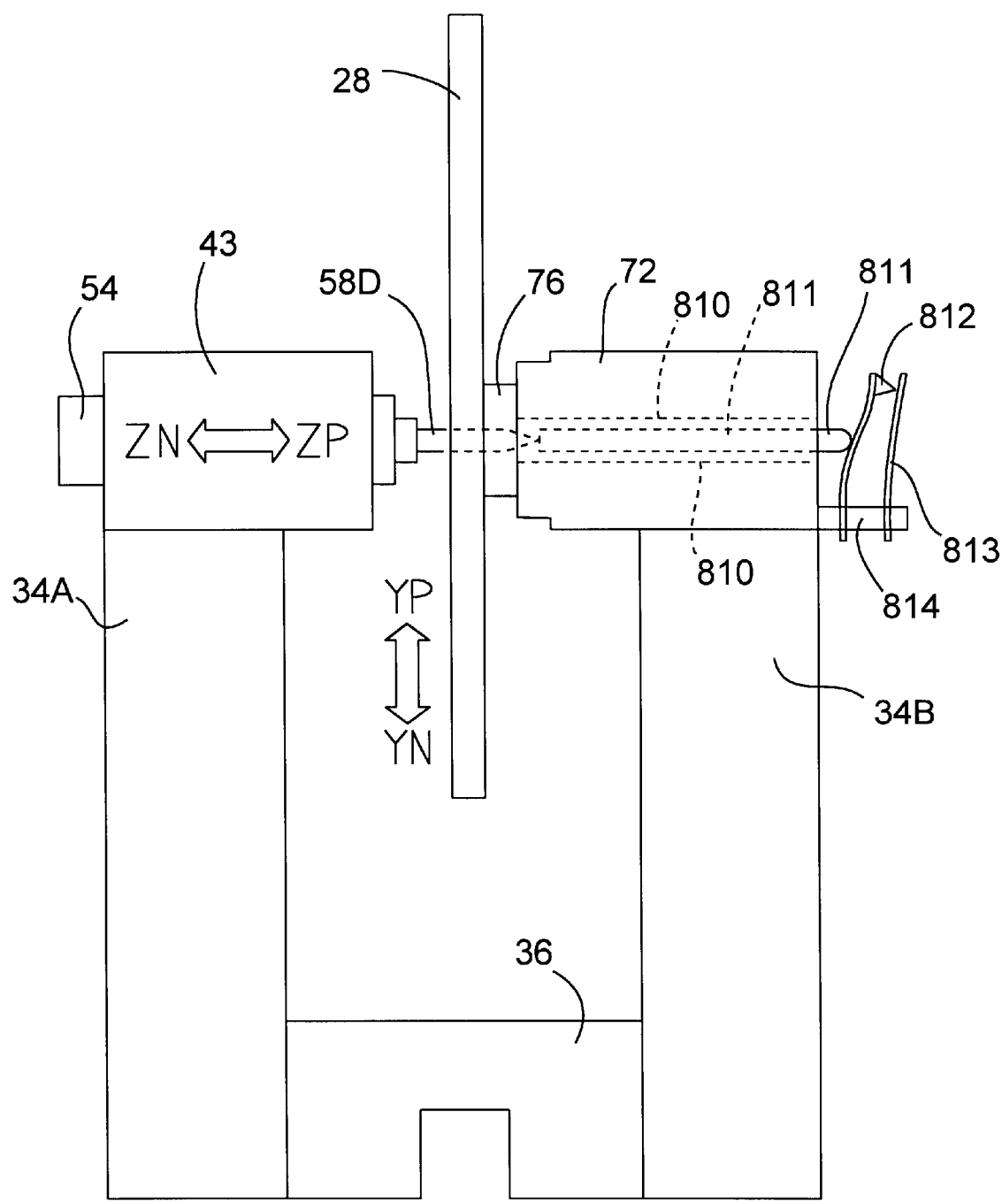
FIG. 8 illustrates sensing of tool position.

Reference Numerals in Drawings 10 base plate
11 first support surface
12 X-axis balance rail support
15 common positioner member
20A Y-axis upright support plate
20B Y-axis upright support plate
20C Second support surface
21 Y-axis guide rail
22 Y-axis carriage assembly consisting of:
23A,B Y-axis slide units
23C and 23D threaded open surfaces
24 workpiece mount
25A,B thumb screws
28, 28N, 28P workpiece, ZN face, ZP face
30 X-axis guide rail
32 U-shaped carriage assembly consisting of:
34A,B upright arms
36 X-axis slide unit
38A,B head mounts
40 tool head assembly consisting of:
42 tool head bracket
43 trapezoidal grooved surface
44A,B thumb screws
45A,45B threaded open surfaces
46 solenoid
48 solenoid plunger
50 z-axis guide block
52 z-axis shafts
54 spindle motor
55A,B solenoid brackets
56 adjustable depth foot
58, 58D, 58K 58R tool, drill bit, milling tool, or routing tool
60 spring-loaded pressure foot
62 spindle housing
70 back-up head assembly consisting of:
72 back-up bracket
73 trapezoidal grooved surface
74A,B thumb screws
75A, 75B threaded open surfaces
76, 76D, 76M back-up tool, drilling backup tool, milling backup tool
80 balance rail
82 balance rail slide unit
90 A, B, C, D, E, F, G, H through-holes, (A–D are prior art)
91 A, B, C, D, E, F, &, H Annular rings—board side one
92 A, B, C, D, E, F, G, H annular rings—board side two
Items 110 through 185 relate to a conventional flatbed machine design:
110 table/bed
120 Y-axs carriage assembly
121 Y-axis rail
130A,B X-axis rail
154 tool head
158 tool
185A,B board mounting/alignment pins
Items 400–499 are unique to FIG. 4 (fixed workpiece variation) but have similar functions to similarly numbered items 00 to 99.
410 Base Plate
420 Y axis support—X axis slideable
421A, 421B Y axis guide rails
424 workpiece mount
430A, B X axis guide rails
432 U-shaped carriage assembly consisting of:
434A, 434B Y-axis carriage arms
436 Y-axis slide unit
Items 500–599 are unique to FIG. 5 (fixed tool variation) but have similar functions to similarly numbered items 00 to 99.
520 Y-axis support—X-axis slideable
521A, 521B Y axis guide rails
523 Y-axis slide unit
524 Workpiece mount
530A, B X-axis rails
534A, 534B fixed upright arms of U-shaped assembly
Items 600–699 are unique to FIG. 6 (two head pair variation) but have similar functions to similarly numbered items 00 to 99.
632 U-shaped Carriage Assembly
634C, 634D, 634E, 634F upright arms
636 X-axis slide unit
640A, 640B Tool head assembly
670A, 670B Backup head assembly
Items 700–799 are depicted in FIG. 7
714 Computer 716 Controller
720B Y-axis upright support plate
722 Y-axis carriage assembly
726 cable
727 idle pulley
729 counterbalance weight
734A, B Upright arms
740 Tool Head Assembly
758 automated tool
770 Backup Head assembly
786A, 786B, 786C—Electrical conductors
787 electrical signal conductors cabling
788A, 788B electrical receptacles
789A, 789B Axis drive motors
Items 800–899 are depicted in FIG. 8
810 Cylindrical wall of hole
811 Plunger
812 first switch contact
813 second switch contact
814 switch assembly Preferred embodiments for the present invention will be described hereunder with reference to FIGS. 1A to 8. While this invention is susceptible of embodiment in many different forms, there is shown in the drawings and will herein be described in detail, specific embodiments, with the understanding that the present disclosure is to be considered as an exemplification of the principles of the invention and is not intended to limit the invention to the embodiments illustrated.

For example, while a flat workpiece could be worked through the use of more exotic methods such as laser cutters, electrochemical machining, and the like, my discussion is limited to conventional drilling and milling methods as applied to a PCB working machine.

Note: certain parts of the apparatus can be interchanged with each other which would change their spatial relationship to other parts. All references to parts in this "description" section assume they are positioned as depicted in the figure being actively described.

Figure 1A:
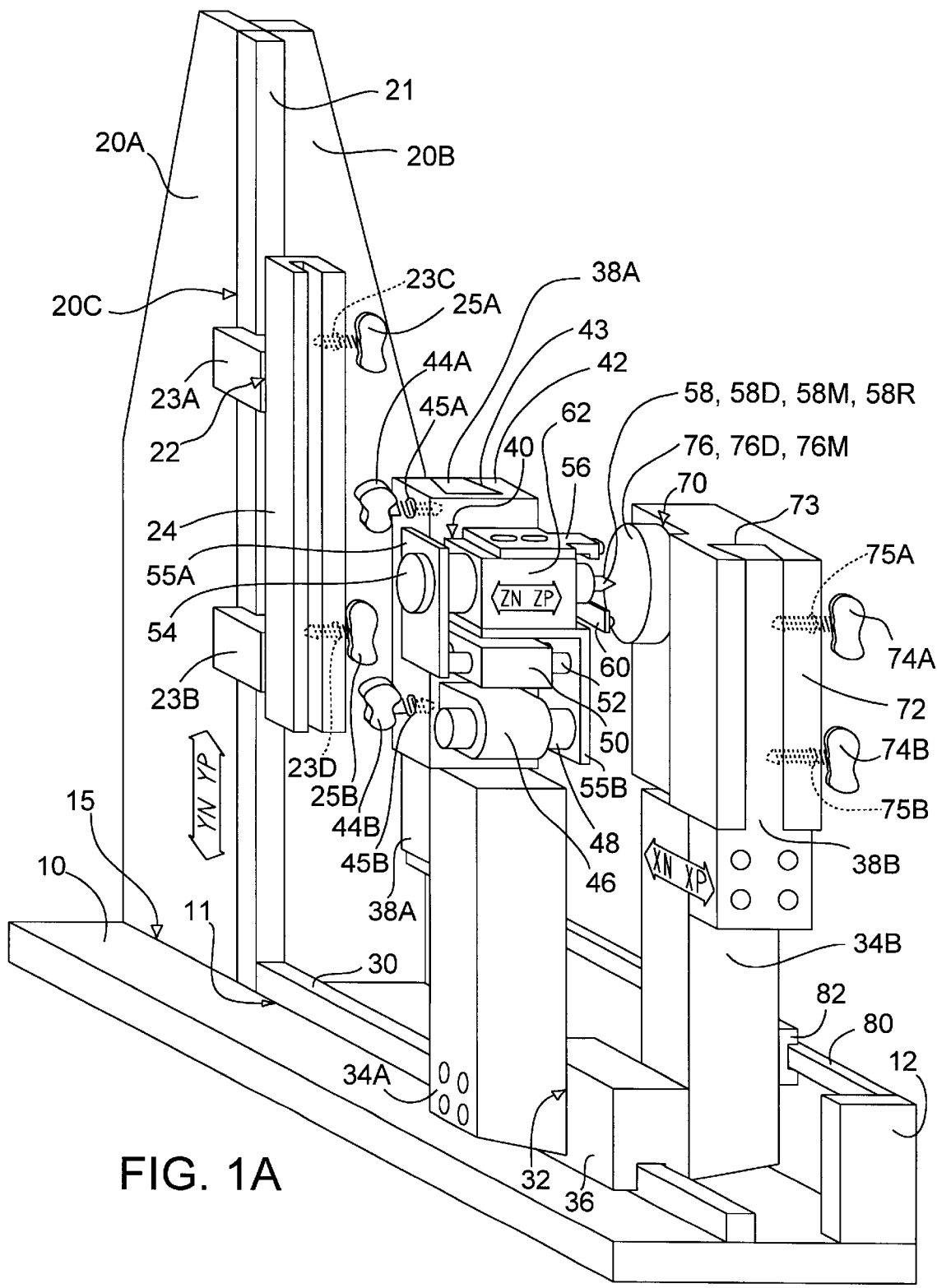
FIG. 1A is an overall isometric view of the apparatus of the present invention.
Figure 1B:
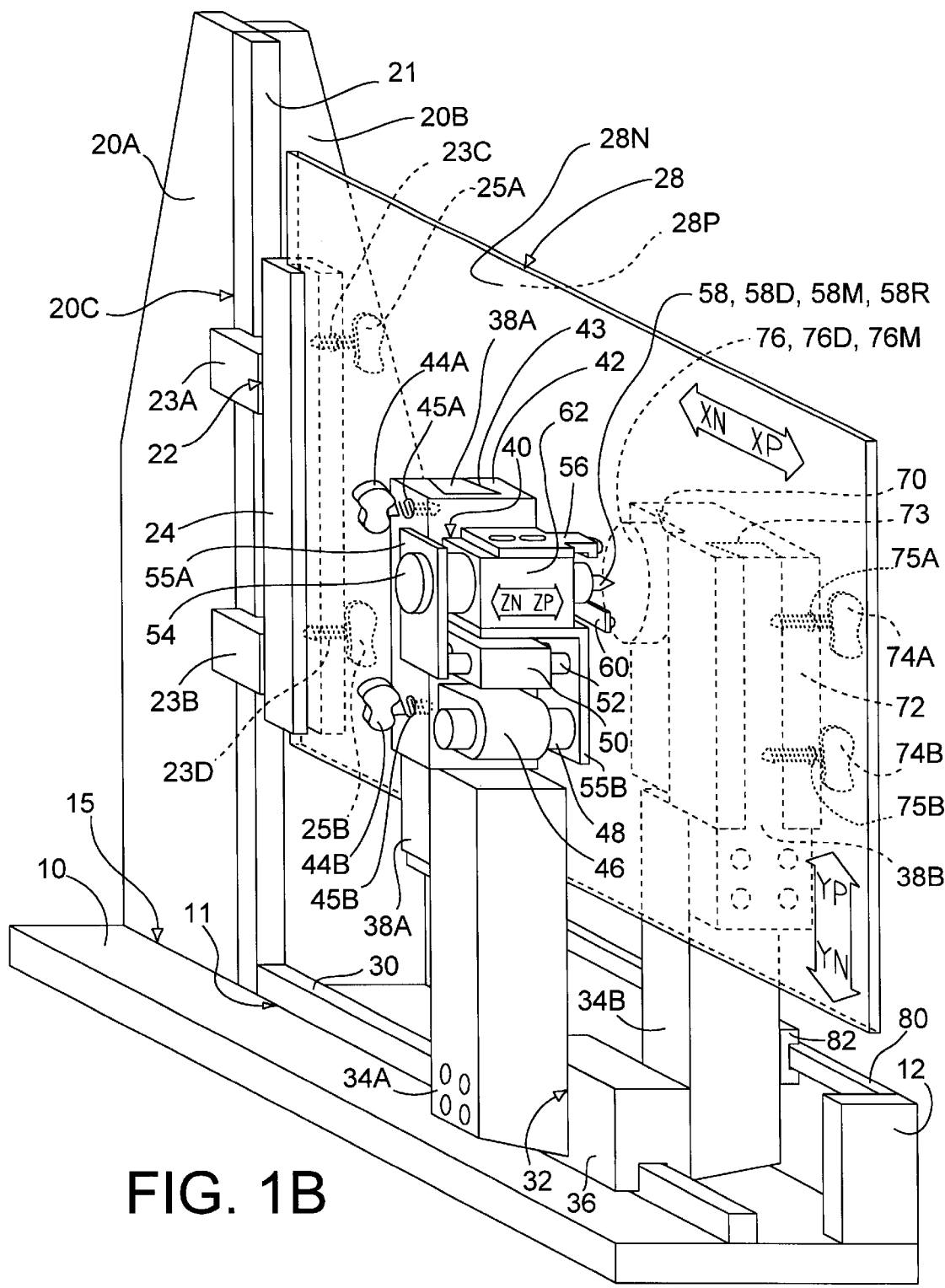
FIG. 1B is the same as FIG. 1 except with workpiece mounted thereupon.
Figure 1C:
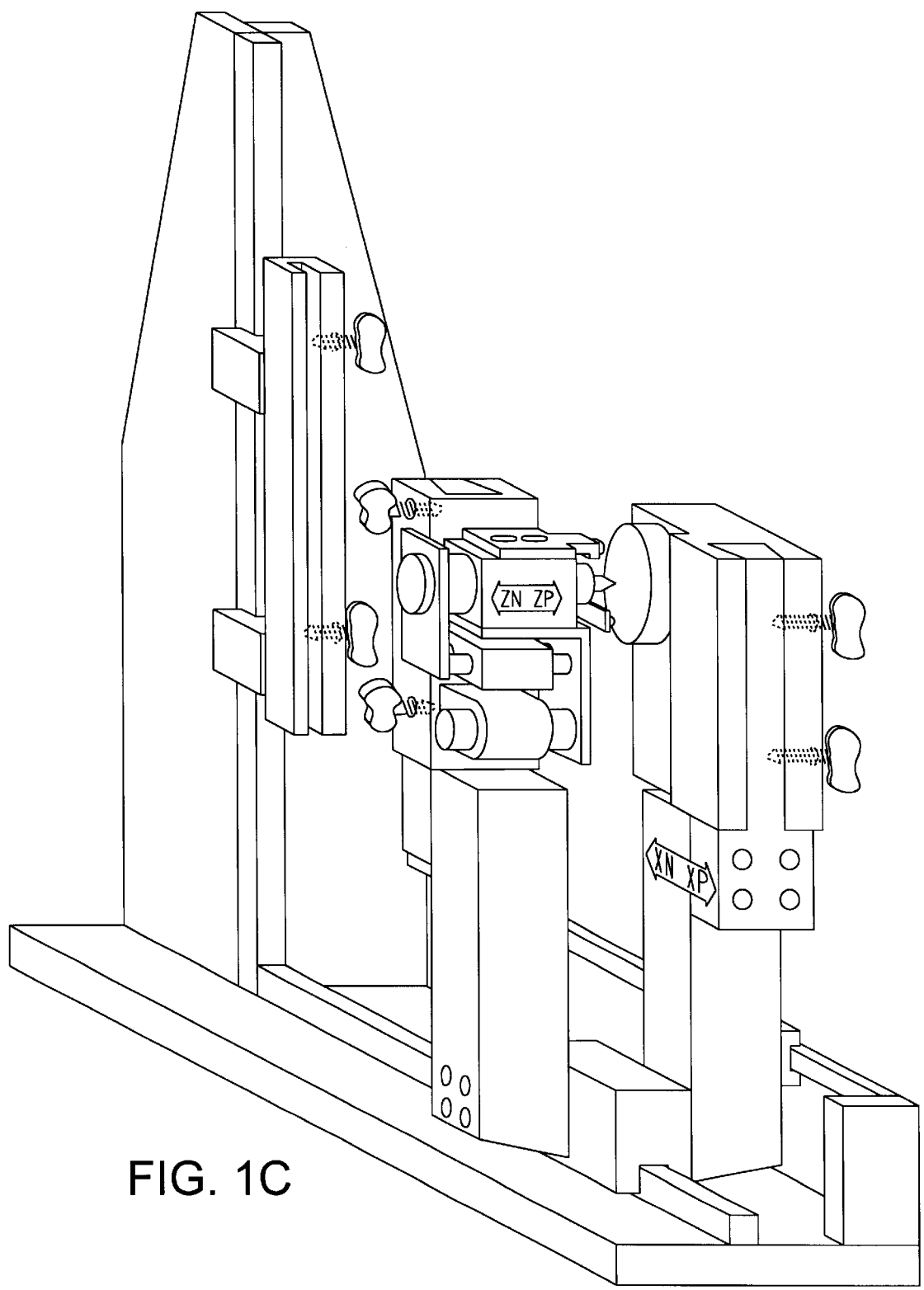
FIG. 1C is the same as FIG. 1A without item numbers for reference clarity.
Figure 1D:
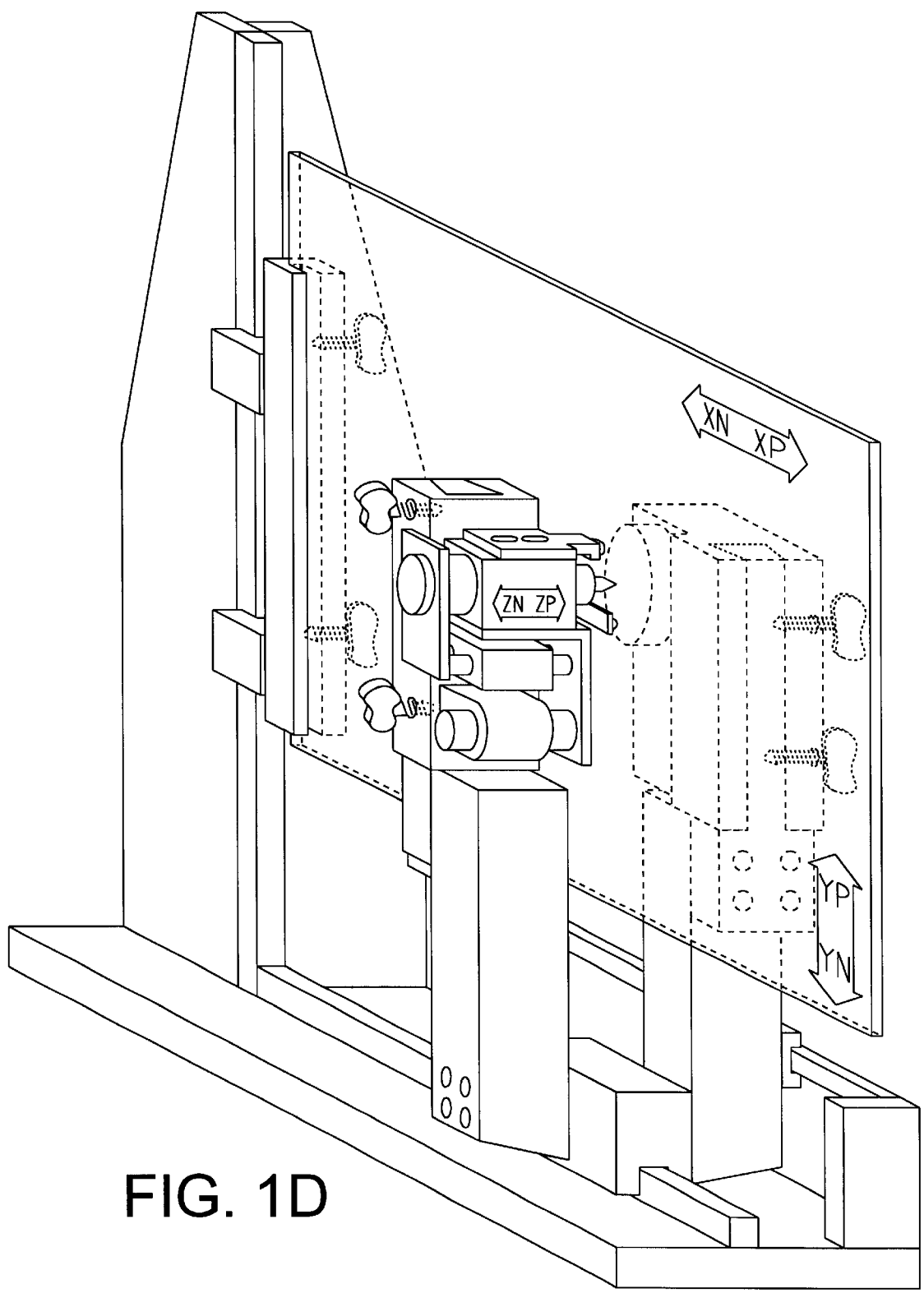
FIG. 1D is the same as FIG. 1B without item numbers for reference clarity.

A first embodiment of the flat workpiece working machine of the present invention is illustrated in FIG. 1A and 1B (isometric views). In general there are forces and reciprocating motions acting in this embodiment in three different axes which are arbitrarily labeled the X-axis (front to back), the Y-axis (top to bottom), and the Z-axis (left to right). In general the embodiment complies with the rules of a three-dimensional rectangular Cartesian coordinate system. I have further labeled the positive and negative components of the three axes (indicated by the three directional arrows on FIG. 1) as follows:

XN=X-Negative direction or X-negative side of machine parts.
XP=X-Positive direction or X-Positive side of machine parts.
YN=Y-Negative direction or Y-Negative side of machine parts.
YP=Y-Positive direction or Y-Positive side of machine parts.
ZN=Z-Negative direction or Z-Negative side of machine parts.
ZP=Z-Positive direction or Z-Positive side of machine parts.

The machine framework of FIG. 1A includes a base plate 10, a Y-axis upright support plate 20A, a Y-axis upright support plate 20B and a X-axis balance rail support 12, all rigidly affixed to each other orthogonally forming a common positioner member 15 as follows:

1) the YP-side plane of base plate 10 lies substantially parallel to the X-axis and Z-axis,
2) the ZP-side plane of upright support plate 20A lies substantially parallel to the X-axis and Y-axis,
3) the XN-side plane of balance rail support 12 lies substantially parallel to the Z-axis and Y-axis, and
4) the XP-side plane of upright support plate 20B lies substantially parallel to the Z-axis and Y-axis.

A Y-axis carriage assembly 22 includes a plurality of slide units 23A and 23B which are rigidly connected by a workpiece mount 24. A Y-axis guide rail 21 may be rigidly affixed or integrally formed to upright support plate 20A. Y-axis carriage assembly 22 is slidably mounted to Y-axis guide rail 21 via its slide units 23A and 23B. Rail 21 is aligned on plate 20A such that carriage 22 will slide substantially along the Y-axis.

Precise reciprocating Y-axis positioning of Y-axis carriage assembly 22 is provided by a power lead screw mechanism (not shown) or other means well known in the art. Threadably disposed in a pair of threaded open surfaces 23C and 23D of workpiece mount 24 are a plurality of thumb screws 25A, and 25B, respectively. Thumb screws 25A and 25B enable a flat workpiece 28 to be securely mounted at one side in an X and Y-axis plane. Workpiece 28 could be of any flat, rigid material but, for the purpose of this discussion, is considered to be a printed circuit board (PCB). An inverse, or second, workpiece ZP Face 28P can be worked from the ZP machine side.

An X-axis guide rail 30 may be rigidly affixed or integrally formed to base 10. A U-shaped carriage assembly 32 is slidably connected to X-axis guide rail 30 via an X-axis slide unit 36, thus permitting reciprocation substantially along the X-axis. U-shaped carriage assembly 32 includes a plurality of upright arms 34A and 34B which are rigidly connected or integrally formed to X-axis slide unit 36. Disposed on the YP end of arm 34A is a head mount 38A and on the YP end of arm 34B is a head mount 38B. Together arms 34A and 34B, mounts 38A and is 38B, and X-axis slide unit 36 form the rigid U-shaped X-axis carriage assembly 32. Upright arms 34A and 34B and their respective mounts 38A and 38B are substantially identical except that they are positioned on opposite Z sides of X-axis slide unit 36 and upright arm 34B is connected to a balance guide rail 80.

Balance guide rail 80 is disposed between X-axis balance rail support 12 and Y axis upright support plate 20B such that a balance rail slide unit 82, being affixed to U-shaped carriage assembly 32, assists in supporting upright arms 34A and 34B in their upright positions substantially parallel to the Y axis. The purpose of balance rail 80 and balance rail slide unit 82 is to steady U-shaped carriage assembly 32 on X-axis guide rail 30.

The plane formed by the YP-side of base plate 10 represents a first support surface 11 and a line lying on surface 11 and parallel to the slidable motion of carriage 32 represents a first axial line. The plane formed by the XP-side edge of plate 20A represents a second support surface 20C and a line lying on surface 20C, parallel to the slidable motion of carriage 22, and intersecting the first axial line represents a second axial line. The first axial line and second axial line lie in a common plane which is also common to a plane which lies substantially parallel to ZP face 28P and a ZN face 28N of workpiece 28 when mounted to mount 24.

X and Y-axis guide rails 30 and 21, respectively, are mutually and permanently aligned such that when workpiece 28 is secured in workpiece mount 24, the space representing the X-Y plane halfway between upright arms 34A and 34B substantially superimposes the center X-Y plane of workpiece 28.

Precise reciprocating X-axis positioning of carriage 32 is provided by a power lead screw mechanism (not shown) or other means well known in the art. A tool head assembly 40, shown mounted to arm 34A, and a backup head assembly 70, shown mounted to arm 34B, complete FIG. 1 and are further detailed in the following paragraphs.

In general, though, the locations of head assembly 40 and 70 are interchangeable in that either head assembly 40 or 70 head can be mounted on either upright arm 34A or 34B by use of respective head mounts 38A and 38B.

Tool head assembly 40 and back-up head assembly 70 could take a variety of forms depending on the application for which the flat workpiece working apparatus is intended. The application chosen for the preferred embodiment is conventional drilling, milling, and routing.

As viewed from the YP side of the apparatus, head mounts 38A and 38B are trapezoid shaped. The functional components of tool head assembly 40 are disposed on a tool head bracket 42 which has a complimentary trapezoidal grooved surface 43 machined therein.

Likewise, the functional components of back-up head assembly 70 includes a tool head bracket 72 which has a complimentary trapezoidal grooved surface 73 machined therein.

Brackets 42 and 72 are machined trapezoidally such that they are slidable in the y-axis over respective trapezoidally machined mounts 38A and 38B. Brackets 42 and 72 are tapped with a plurality of threaded open surfaces 45A, 45B and 75A and 75B, respectively, to receive a plurality of threaded thumb screws 44A, 44B, and 74A, and 74B, respectively, for the purpose of firmly securing them to their respective head mounts 38A and 38B.

Other than the fact that tool head assembly 40 is demountable, it is similar to those presently used in the trade. A brief description follows to further familiarize the reader with FIG. 1.

Rigidly affixed to tool head bracket 42 is a solenoid 46 and a Z-axis guide block 50. All remaining tool head assembly 40 parts are rigidly linked together. They reciprocate in the Z-axis as commanded by solenoid 46 and are introduced in the following paragraph.

A solenoid plunger 48 is operably connected with solenoid 46 and a plurality of Z-axis shafts 52 are associated with block 50. Plunger 48 and shafts 52 are joined by a solenoid bracket 55B. Also, disposed on solenoid bracket 55B is a spindle housing 62 which, in turn, supports a spindle motor 54.

Another solenoid bracket 55A further rigidly connects the ZN side of motor 54 to shafts 52. A tool chuck (not shown) disposed on the rotor of motor 54 holds a machine tool 58 such that the tool axis is positioned substantially within the Z-axis. An adjustable depth foot 56 is provided to limit or adjust the depth that tool 58 can penetrate into or through workpiece 28.

All interconnecting parts of U-shaped carriage assembly 32 and tool head assembly 40 are mutually calibrated such that the axes of Z-axis shafts 52, and tool 58 are aligned to reciprocate substantially within the Z-axis as commanded by solenoid 46. A spring-loaded pressure foot 60 is disposed on bracket 42 and formed such that constant pressure is applied against the ZN side of workpiece 28. The function of foot 60 is to ensure separation of workpiece 28 and tool 58 at all times except when engaged by solenoid 46.

A primary purpose of the back-up head assembly 70 is to contain workpiece 28 substantially within the common X-Y plane lying between upright arms 34A and 34B. Disposed on back-up bracket 72 is a back-up tool 76. In general, the form, design, or material of back-up tool 76 would depend upon what type of tool is installed in tool head assembly 40. For example, a laser cutting tool installed in tool head assembly 40 may require a laser sensor or receiver in back-up head assembly 70. For conventional milling, routing, and drilling though, back-up tool 76 appears in two different forms, both in the shape of pads having a re-positionable adhesive applied to the ZP side to temporarily hold them onto the ZN side of bracket 72. Construction material of a back-up tool 76D, as used during a drilling process, would be of a special back-up material commonly utilized in the trade. Its purpose is to receive a drill bit 58D as it penetrates the back side of workpiece 28 in order to minimize backside breakout of workpiece 28 material.

The same material would be used when a routing tool 58R is being utilized to cut the outline of a small circuit board as well as making oversized or irregularly shaped holes in workpiece 28.

On the other hand, during a milling process, tool 58 and foot 56 are engaged against workpiece 28 as head assemblies 40 and 70 traverse in various X-Y vectors relative to workpiece 28. This relatively strong force is transferred through workpiece 28 creating a relatively higher tension of workpiece ZP face 28P against a milling back-up tool 76M during X-Y motion. In this case, the primary concern for material selection of back-up tool 76M is that it presents minimum friction against workpiece ZP Face 28P in order to not affect X-Y positioning and not damage workpiece ZP Face 28P. One option would be selection of material for back-up tool 76M in the form of a felt pad, again applied to bracket 32 with re-positional adhesive or other mechanical means.

In FIG. 1, the tool head assembly 40 is shown mounted onto the upright arm 34A with working end of the tool 58 facing the ZP direction. It can also be mounted on the arm 34B with the tool 58 facing the ZN direction and the ZP side of the workpiece 28. In fact, the arms 34A and 34B and the mounts 38A and 38B are factory aligned such that when the tool head assembly 40 is thus reversed, the axis of tool 58 will be substantially coaxial with a line extended from the axis of the tool 58 when it was mounted on the opposing the arm 34A or 34B. While such alignment is not absolutely necessary, it will be seen that maximum benefit of the unique features of the apparatus would be gained by doing so.

It will be readily apparent that the operation of the present invention lends significant advantages of the art.

As seen in FIG. 7, digital instructions that control operation of the apparatus are prepared in a computer 714 and, when ready, sent through a driving controller 716, and through a plurality of electrical signal conductors 787 to an X-axis drive motor 789A, a Y-axis drive motor 789B, and a pair of electrical receptacles 788A and 788B. Like receptacles 788A and 788B are disposed on respective uprights 34A and 34B for convenience of plugging in an automated tool head 740 which contains electrical components including spindle motor 54 and solenoid 46 and could be mounted to either of a pair of automated uprights 734A or 734B.

A blank copy of workpiece 28, to be drilled and engraved, is fitted into workpiece mount 24 and secured by thumb screws 25A and 25B such that it lies in the X-Y plane between arms 34A and 34B. Workpiece 28 will remain thus mounted throughout the entire process of drilling, engraving, and routing of both ZN and ZP faces 28M and 28P.

As seen in FIGS. 3A and 3B for this example, a set of four drilled holes 90E through 90H, a set of four respective engraved annular rings 91E through 91H and another set of four milled annular rings 92E through 92H will be described.

The tool head assembly 40 is then mounted to upright support arm 34A by sliding bracket 42 over mount 38A and securing wilt thumb screws 44A and 44B. Through the computer keyboard (not shown) the operator commands the Y-axis to traverse to the maximum YN position, which is considered a tool-load-point. In this position the axis of spindle motor 54 is further YP than the YP edge of workpiece 28, thus enabling tool 58 to be inserted into the chuck of [the] motor 54. Appropriate adjustments are made to tool head assembly 40 to achieve correct throw and depth of cut as is common in the practice.

Backup tool 76D is installed on back-up bracket 72 and back-up head assembly 70 is mounted to upright support arm 34B by sliding bracket 72 over mount 38B and securing with thumb screws 74A and 7413. Typically drill bit 58D will penetrate through workpiece 28 into backup tool pad 76D. Therefore, because the same hole first drilled into backup pad 76D will be used repeatedly for all drill bits 58D, the smallest diameter drill bit 58D is first called for by the computer program. After a set of small diameter holes 90E through 90H are drilled through workpiece 28, the next larger diameter is called for etc. until all required diameter holes 90E through 90H are drilled through workpiece 28 as instructed by the computer program.

The machine operator again commands heads 40 and 70 to traverse to the tool-load-point whereupon a milling tool 58M is installed into the chuck (not shown) of spindle motor 54 for the purpose of engraving annular circuit pads 91E through 91H around drilled holes 90E through 90H as well as interconnecting land circuit traces (not shown). Back-up tool 76D is replaced by milling back-up tool 76M and workpiece ZN Face 28N is then completely engraved. In this way the operation accomplishes objectives as did previous flat-bed machine designs commonly used in the trade.

Now workpiece 28 has been completely drilled and the ZN Face 28N engraved. In order to engrave workpiece ZP Face 28P, the positions of tool head assembly 40 and the backup head assembly 70 are reversed. This is accomplished by loosening thumb screws 44A, 44B, 74A, and 74B, sliding tool head assembly 40 and 70 off their the respective mounts 38A and 38B, and re-installing on opposite mounts 38B and 38A as previously described. Engraving of annular rings 92E through 92H around the drilled holes 90E through 90H and interconnecting land traces (not shown) on ZP Face 28P then continues to program completion.

Figure 2A:
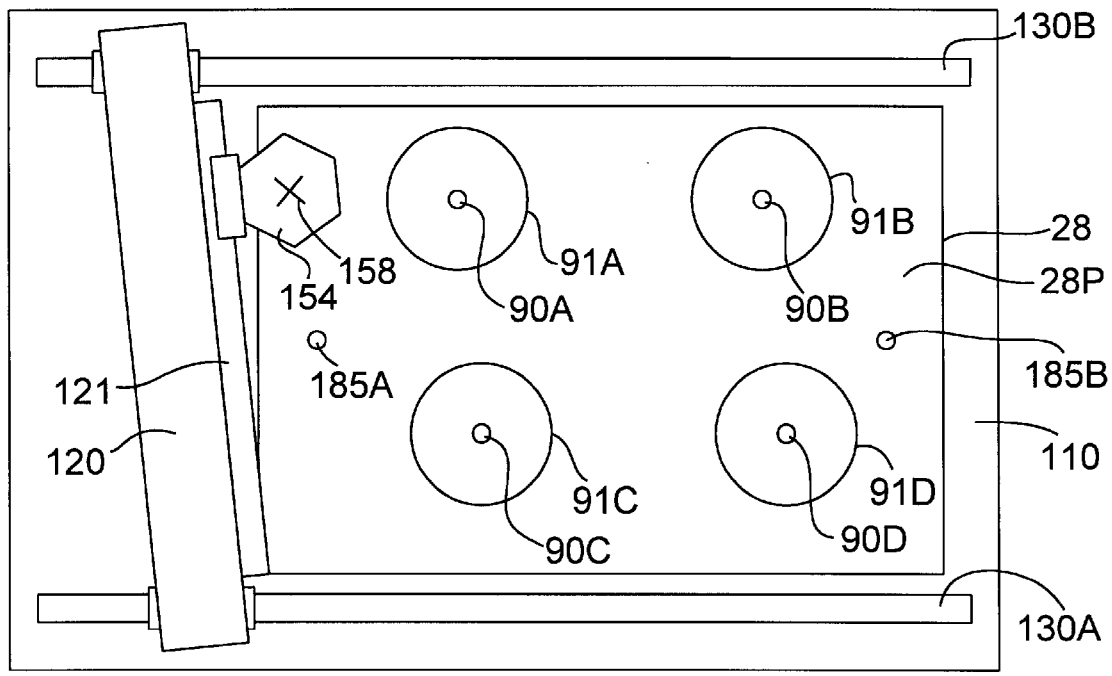
FIG. 2A illustrates a plan top view of a prior art flat bed.
Figure 2B:
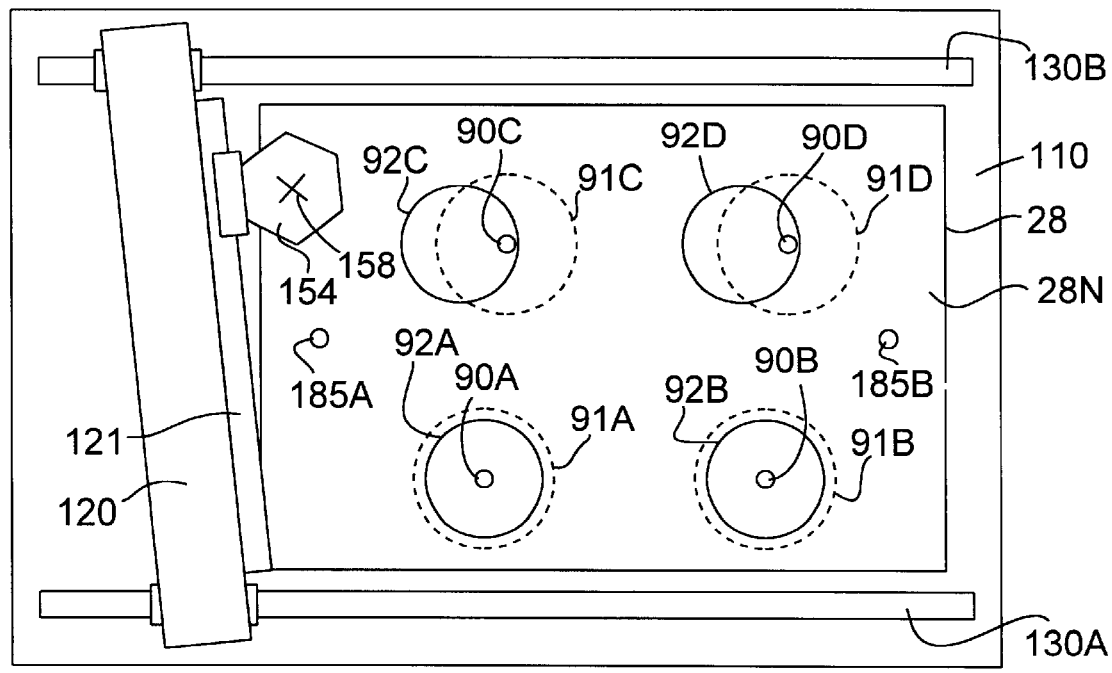
FIG. 2B illustrates an undesirable result of a misaligned flatbed of FIG. 2A.

FIGS. 2A and 2B illustrate the problem inherent in drilling and engraving double-sided PCB's on machines of current technology which requires the workpiece to be flipped over to access opposing sides. FIGS. 2A and 2B represent such a flatbed machine well known to those in the art. A pair of flatbed X-axis rails 130A and 130B are disposed on a table/bed 110 such that a flatbed Y-axis carriage 120 is confined to sliding in the XP/XN directions when so commanded by controlling software (not shown).

A flatbed Y-axis rail 121 is disposed on Y-axis carriage assembly 120 such that when commanded, a flatbed tool head 154 should slide in the YP/YN directions. However, in this case, Y-axis carriage assembly 120 is misaligned such that Y-axis rail 121 is grossly non-perpendicular to rails 130A and 130B. On these simplified illustrations, a flatbed tool axis 158 of tool head 154 is represented by an "X".

A plurality of board mounting/alignment pins 185A and 185B are permanently pressed into table/bed 110 such that they lie substantially within a Y-axis line halfway between rails 130A and 130B. A blank copy of workpiece 28, which is pre-drilled with a pair of holes to match the spacing of pins 185A & B, is fitted over the pins in preparation to drill and engrave the first-side circuitry.

FIG. 2A illustrates the status of process after the obverse side of workpiece 28 has been drilled and milled. First four through-holes 90A, 90B, 90C, and 90D are drilled in what should have been a rectangular pattern. However, because Y-axis guide rail 121 is skewed, the pattern appears as a parallelogram. Then a set of four annular rings 91A, 91B, 91C, and 91D are milled around four holes 90A through 90D. As intended, four annular rings 91A through D are substantially coaxial with respective four holes 90A through D because, thus far, drilling and milling have been done on the same workpiece face 28P.

On the flatbed machine as depicted in FIGS. 2A and B, in order to mill annular rings on the inverse side of workpiece 28P, workpiece 28 is lifted off pins 185A and 185B, flipped over, and re-inserted such that the same guide holes are fitted over same guide pins 18SA and B. This step is now completed as illustrated on FIG. 2B.

FIG. 2B illustrates the status of process after workpiece 28 has been flipped and a set of four inverse-side annular rings 92A, 92B, 92C, and 92D have been milled around respective through-holes 90A, 90B, 90C, and 90D utilizing mirror-imaged software. The intention was for these four annular rings 92A through 92D, respective holes 90A through 90D, and respective obverse side annular rings 91A through 91D to be coaxial as like work appears in FIG. 3B. Prior to milling inverse-side annular rings, the machine is manually offset such that when drilled, a first annular ring 92A will be coaxial with hole 90A. Under program control, ring 92B will also appear substantially coaxial with respective hole 90B and ring 91B. However, as milling continues under program control, rings 92C and 92D are milled substantially offset from their ideal coaxial positions around respective holes 90C and 90D and rings 91C and 91D. This undesirable offset is a result of Y-axis rail 121 being skewed.

FIGS. 2A and 2B illustrate but one of a myriad of alignment afflictions that similarly limit the ability of machines to accurately converge machined work on one side of a flat workpiece to work performed on the opposite side when flipping of the workpiece is involved. These problems directly affect the resolution or fineness of the printed circuit artwork being performed on double sided PCBs.

FIGS. 3A and 3B illustrate the solution provided by the preferred embodiment of this patent to the problems described in the above paragraphs of this section. Both FIGS. 3A and 3B are views from the YN-side of the preferred embodiment. General operation was previously described in the operation section of this patent As in FIGS. 2A and 2B, FIGS. 3A and 3B illustrate Y-axis plate 20A being grossly misaligned such that Y-axis rail 21 is not perpendicular to X-axis rail 30.

FIG. 3A illustrates that as described for FIG. 2A, the programmed drilling of an intended rectangular pattern of four through-holes 90E, 90F, 90G, and 90F actually results in a parallelogram pattern when the preferred embodiment is so misaligned. As intended, four annular rings 91E, 91F, 91G, and 91H appear substantially coaxial to respective holes 90E through 90H when milled from the same workpiece side under program control. Drilling and milling, in FIG. 3A, were performed with tool head assembly 40 mounted on the YN-side arm 34A. Work, thus far, was performed on the obverse side of workpiece 28.

FIG. 3B illustrates the programmed milling of four inverse-side annular rings 92E, 92F, 92G, and 921H around their respective holes 90E through 90H. In this case, however, workpiece 28 was not flipped in order to access the inverse side. Rather, tool head 54 was removed from the YN-side arm 34A and reinstalled on the YP-side arm 34B. Therefore, annular rings 92E through 92H all appear substantially coaxial with their respective holes 90E through 90H and obverse side annular rings 91E through 91H, the desirable effects of machine misalignment being similarly reproduced on opposing workpiece 28 sides.

Another illustrated benefit is that it is not necessary to manually offset the position of either axis prior to beginning inverse-side machining.

FIG. 4 illustrates another variation of the present invention. In this variation workpiece 28 remains fixed to a type-four base 410 (hereinafter, "type" followed by a number designation refers to the embodiment of the invention represented in the figure of that number designation, i.e., "type-four mount" indicates a mount of the embodiment illustrated in FIG. 4) by a type-four mount 424 rigidly connected thereto throughout machine operation rather than reciprocating in either the X or the Y-axis. Head assemblies 40 and 70 traverse in unison in both the X and the Y axes. This is accomplished as follows:

a type-four Y-axis support 420 is X-axis-slidably mounted over a pair of type-four workpiece rails 430A and 430B which are mounted on base 410;

a type-four U-shaped carriage assembly 432, which includes a type-four Y axis slide unit 436, is Y-axis-slidably mounted over a pair of type-four common rails 421A and 421B; and a pair of type-four carriage arms 434A and 434B serve same function as previously described arms 34A and 34B except that they traverse in unison in both X and Y-axes, which may be manually positioned or automatically positioned according to pre-determined programmed instructions.

FIG. 5 illustrates another variation of the flat workpiece working machine. In this variation, heads 40 and 70 remain fixed to base 10 through a pair of fixed uprights 534A and 534B which virtually serve same function as previously described arms 34A and 34B respectively throughout machine operation.

In this version, heads 40 and 70 do not reciprocate in X or Y direction. Rather, workpiece 28 is able to traverse in both the X and the Y-axes. This is accomplished as follows:

a type-five Y axis support 520 is X-axis-slidably mounted over a pair of type-five X-axis rails 530A and 530B;

a type-five Y-axis-slide unit 523 is slidably mounted over a pair of type-five rails 521A and 521B to Y-axis support 520;

a type-five workpiece mount 524 is rigidly disposed on slide unit 523; and workpiece 28 is removably mounted to mount 524 and thus is capable of traversing in either the X or Y-axes via manual positioning or automated positioning via predetermined programmed instructions.

FIG. 6 is a top (YP) perspective of a modified FIG. 1, which illustrates a dual-spindlemotor variation of the apparatus for working double sided workpiece. A type-six U-shaped carriage assembly 632, consisting of a plurality of paired upright arms 634C through 634F disposed on a dual tool X-axis slide unit 636, serves the same function as carriage 32 in FIG. 1, with the provision of an added function. Upright arm 634C is disposed on the XP/ZN corner of slide unit 636 and disposed on arm 634C is a fixed tool head 640A. Upright arm 634D is disposed on the XP/ZP corner of slide unit 636 and disposed on arm 634D is a dual backup head 670A. Arm pair 634C and 634D and head pair 640A and 670A serve the same function as arms 34A and 34B and heads 40 and 70 previously described except that the heads can remain fixed rather than removable such that tool head 640A would be limited to working on or from the ZN side of workpiece 28.

Additionally, upright arm 634E is disposed on the XN/ZP corner of slide unit 636 and disposed on arm 634E is a tool head 640B. A paired upright arm 634F is disposed on the XN/ZN corner of slide unit 636 and disposed on arm 634F is a fixed backup head 670B. Arm pair 634E and 634F and head pair 640B and 670B also serve the same function as arms 34A and 34B and heads 40 and 70 previously described except that the heads can remain fixed rather than removable such that tool head 640B would be limited to working on or from the ZP side of workpiece 28.

The object of the head arrangement depicted in FIG. 6 is that both sides of a double sided workpiece could be worked without having to reposition the tool/backup heads from one Z-side of the workpiece to the other. However, tool offsetting would be required in the X-axis when working opposing sides of workpiece 28 which could degrade from the fall benefits of the preferred embodiment as described for FIG. 1.

FIG. 7 Illustrates, in simplified form, a preferred embodiment connected to programmable computer 714. The reader is spared in-depth details of computer programming as it will be apparent to those skilled in the art. Digital instructions from computer 714 are downloaded to a controller 716 through an electrical conductor 786A. The controller 716 converts the received digital instructions to a suitable protocol to be received by various electrical devices required on the preferred embodiment to properly position an automated tool head 740 and an automated backup head 770 over workpiece 28 (not shown in FIG. 7), cause an automated tool 758 to rotate, and engage tool 758 to workpiece 28.

Appropriate electrical currents flow from controller 716, through conductors 787, to X-axis positioning motor 789A, and Y-axis positioning motor 789B. Appropriate currents also flow through conductors 787 to electrical receptacles 788A and 788B, which are disposed respectively on arms 734A and 734B. As previously noted, heads 740 and 770 could be interchangeable. The receptacles 788A and 788B provide a convenient means to plug electrical components (not shown) from heads 740 and 770 into controller 716 through a multiplicity of electrical head conductors 786B and 786C, as well as conductors 787.

The preferred embodiments of FIG. 1B and FIG. 7 depict carriage assembly 22 or a vertical carriage 722 and other associated Y-axis components which reciprocate in a direction vertical to the earth's surface. Earth's gravity would therefore cause an imbalance in motion that could cause imperfections in the resulting artwork to be engraved on workpiece 28. FIG. 7 illustrates a method and device to minimize the undesirable effects of the force of gravity. A cord or cable 726 has one end connected to carriage 722 and the other end connected to a counterweight 729. Disposed on the YP end of a type-seven upright plate 720B is a pulley assembly 727. Cable 726 is of an appropriate length that when wrapped over Pulley 727, counterweight 729 will remain suspended and thus keep cable 726 taut throughout the vertical travel of carriage 722. The weight of counterweight 729 is selected to be substantially equal to the sum weight of all vertical moving components and thus will serve as a counterbalance to these parts.

FIG. 8 is a XP-side perspective of U-shaped carriage 32 of preferred embodiment having a means for sensing the Z-axis position of tool 58D. A hole having a cylindrical wall 810 is bored through backup bracket 72 such that wall 810 is substantially coaxial with drilling tool 58D. A plunger 811 having a Z-axis length slightly longer than the Z-axis width of bracket 72 is loosely fitted within wall 810 such that it's ZP end is resting against a first electrical contact 812 of switch assembly 814 which is disposed on the ZP side of bracket 72. Contact 812 is normally electrically open from a second switch contact 813. In FIG. 8, drill tool 58D is shown having been actuated towards the ZP direction such that it has bored through workpiece 28 and backup tool 76 and has contacted and pushed plunger 811 against contact 813 such that contacts 812 and 813 are electrically closed. In this manner it will be clear to those in the art that the tool position could be sensed for the purpose of signaling computer 714 that work has progressed to the point that the tool could be backed off from shown engaged position in preparation of continuing to the next X/Y coordinate.

Accordingly, the reader will see that the opposing interchangeable heads of this invention facilitate a method to work both sides of a flat workpiece without disturbing the workpiece mounting and thus maintain high relative precision between both sides regardless of machine's X/Y alignment imperfections. Furthermore, a design incorporating opposing interchangeable heads has additional advantages for a machine producing double-sided work in that:

machine stability is greatly improved;

machine alignment during manufacture is greatly simplified;

software programs are simplified because it is not necessary to "mirror-image" opposing sides;

operating procedures are simplified because offsetting X-axis or Y-axis is not necessary when changing sides, this is especially important when producing multiple pieces of artwork on a single workpiece substrate;

easy access to tool chuck, for tool replacement purposes, is provided;

tool head can be removed for this purpose rather than positioning head off the side of machine table;

progress of work can be monitored or sensed on surface of workpiece opposite the tool head;

a variety of tool heads having special functions could be easily installed by the operator;

a defective head could be easily replaced by the user;

cost, material, and weight of precision flatbed tabletop eliminated;

hole in backup material, produced by first drilled hole in workpiece, can be reused for all remaining holes, again saving operating costs; and workpiece can be positioned vertically saving work space, enabling gravity to remove work debris, and permitting visual observation of both sides of workpiece.

Although the description above contains many specificities, these should not be construed as limiting the scope of the invention but as merely providing illustrations of the preferred embodiment of this invention. Some examples of alternatives are that:

the workpiece could have photosensitive surfaces and the tool could produce a laser or light beam;

the workpiece could have writing surfaces and the tool could be a writing instrument such as an ink pen, which could be especially useful for verifying work prior to utilizing more expensive materials;

the tool could be a laser engraver/cutter, additional tools could be for through-hole fluid dispensing, riveting, or insertion of electronic components;

the workpiece could be of multi-layered plastic laminate such as is commonly used for engraving signs, nameplates and such;

the machine could be designed to produce items as small as integrated circuit chips, as large as sheets of wood for cabinet making etc., or even larger;

the machine could be positioned in any conceivable attitude relative to a support surface, multiple heads could be provided on both sides of the workpiece to enable production of multiple duplicate PCBs in a single operation;

one-piece head/arm assemblies could be interchangeable rather than just the head/tool assemblies or even the complete u-shaped carriage assembly could be made reversible;

both heads, having spindle motors, could be permanently mounted with facilitation for converting either side to a backup head;

the backup head could be designed to rotatably step a disk made of backup material in order to provide a new piece of material for each hole drilled;

the backup head could be fitted with a multi-directional wheel assembly or air bearing to virtually eliminate any marring or scratching of the inverse side during the milling process;

although thumb-screws were selected for use in the illustrations, a final product would likely utilize more time-efficient fasteners such as cam-levers.

Thus the scope of the invention should be determined by the appended claims and their legal equivalents, rather than by the examples given.

What is claimed is:

1. An apparatus for working on both sides of a flat workpiece, said apparatus comprising:

(A) a first support surface having a first axial line thereacross;

(B) a second support surface juxtaposed to and associated with said first support surface and having a second axial line thereacross which lies in a first common plane with said first axial line;

(C) a first carrying assembly operably connected to said first support surface in a manner to movably reciprocate along said first axial line;

(D) a second carrying assembly operably connected to said second support surface in a manner to movably reciprocate along said second axial line, wherein said second carrying assembly includes means for removably mounting said workpiece in a manner to position said workpiece in said first common plane;

(E) a working tool means for performing work on said workpiece removably operably connected to said first carrying assembly in a manner to maintain said working tool means adjacent to a first plane side of said first common plane and to permit said working tool means to perform work from a first workpiece side position to a first face of said workpiece;

(F) a backup tool means for backing up a second face of the workpiece opposite the working tool means, which backup tool means is removably connected to said first carrying assembly such that said backup tool means is maintained adjacent to a second plane side of said common plane, in close proximity to said second workpiece face, and generally opposing said working tool means in a manner to support said workpiece from a second workpiece side;

(G) a first and second actuating means operably connected to respective said carrying assemblies for causing said carrying assemblies to reciprocate along respective said axial lines wherein said tool means are caused to traverse about respective said workpiece sides in unison during a working process;

(H) a tool engagement means connected to said working tool means for causing said working tool means to engage and disengage said workpiece;

(I) an automation means connected to said engagement means and to said actuating means for causing said working tool means to engage and disengage said workpiece and for causing said tool means to traverse about said faces according to an automated predetermined sequence;

(J) said working tool means and said backup tool means having means for mounting to said first carrying assembly, said mounting means configured such that said working tool means can be interchanged with said backup tool means whereby said work can be effected by said working tool means from said second workpiece side;

(K) a means for precisely controlling a depth of penetration of work performed to the workpiece whereby:

(1) said working tool means is adaptable to function either as:
   (a) an inscribing tool for use in inscribing line patterns independently to either of said workpiece faces or
   (b) a cutting tool for use in making hole patterns through said workpiece from either of said sides;

(2) said automation means includes a first data set of instructions for inscribing a first pattern of lines to said first workpiece face and a related second data set of instructions for inscribing a second pattern of lines to said second workpiece face.

2. The apparatus of claim 1, wherein said first axial line and said second axial line are generally perpendicular to one another.

3. The apparatus of claim 1 further including a first and a second extending arm laterally fixedly disposed to said first carrying assembly on respective opposing sides of said first common plane, each arm including a said tool means attached thereto via a said mounting means, and each arm further including a respective first and second axial arm line thereacross, which axial arm lines are coincident with central axes of said working tool means and said backup tool means, wherein said axial arm lines are aligned with one another along a second common plane which is generally perpendicular to said first common plane.

4. The apparatus of claim 3, wherein said mounting means maintains said central axes of said working tool means and said backup tool means at a predetermined angle with respect to said first common plane.

5. The apparatus of claim 4, wherein said mounting means maintains said tool axes perpendicular to said first common plane.

6. The apparatus of claim 3, wherein each said arm includes a tool receiving surface which maintains said tool axes at a predetermined angle to said first common plane.

7. The apparatus of claim 1, which further includes a stabilizing means for stabilizing one of said working tool means and said backup tool means, which maintains said one of said working tool means and said backup tool means at a predetermined distance from said first common plane.

8. The apparatus of claim 1, wherein said automation means includes at least one of: a computer based device, a programmed instruction set, and a digital controller.

9. The apparatus of claim 1, wherein said cutting tool is at least one of a: drilling, boring, cutting, laser cutting, and routing tool, whereas said inscribing tool is at least one of a: milling, routing, drawing, scribing, and cutting tool.

10. The apparatus of claim 1, which further includes a manual engagement means connected to said working tool means for enabling said working tool means to engage and disengage the said workpiece by manual actuation.

11. The apparatus of claim 1, wherein said backup tool means includes means for performing at least one of supporting, preventing breakout, and sensing parameters of an associated working tool means.

12. An apparatus for working on both sides of a flat workpiece, said apparatus comprising:

(a) a first support surface having a first axial line thereacross lying in a first common plane (b) a second support surface juxtaposed to and associated with said first support surface and having a second axial line thereacross which lies in said first common plane (c) a first generally U-shaped carrying assembly operably connected to said first support surface in a manner to movably reciprocate along said first axial line;

(d) said U-shaped carrying assembly having a first extending arm which is laterally displaced from a first side of said first common plane;

(e) said U-shaped carrying assembly having a second extending arm which is laterally displaced from a second side of said first common plane;

(f) a second carrying assembly operably connected to said second support surface in a manner to movably reciprocate along said second axial line, wherein said second carrying assembly includes means for removably mounting said workpiece in a manner to position said workpiece in said first common plane between said arms such that said arms extend about said workpiece; and (g) a first working tool operably connected to said first extending arm in a manner to permit said first working tool to perform work on a first face of said workpiece and a first backup tool operably connected to said second extending arm to aid performing work on the said first face and a second working tool operably connected to said second extending arm in a manner to permit said second working tool to perform work on a second face of said workpiece and a second backup tool operably connected to said first extending arm to aid performing work on said second face.

13. The apparatus of claim 12, which further includes a first and second actuating means operably connected to respective said carrying assemblies for causing said arms to traverse about said first common plane in unison according to one of automated and manual actuation.

14. The apparatus of claim 13, wherein said actuation is automated and includes a computer based device connected to said actuating means.

15. The apparatus of claim 12, wherein said first working tool and said second working tool include means for performing at least one of drilling, milling, routing, drawing, sensing, scribing, and cutting said workpiece.

16. The apparatus of claim 12, wherein said first working tool includes a predefined first tool axis and said second working tool includes a predefined second tool axis and both said tool axes are positioned substantially perpendicular to said first common plane.

17. The apparatus of claim 12, which further includes means connected to said first working tool and said second working tool for causing said first working tool and said second working tool to engage and disengage the said workpiece according to one of automated and manual actuation.

18. The apparatus of claim 17, wherein said actuation is automated and includes a computer based device.

19. The apparatus of claim 12, wherein said first backup tool and said second backup tool include means for performing at least one of supporting, preventing breakout, and sensing a position of the associated working tool.

20. The apparatus of claim 12, wherein said first working tool and said second working tool are operably connected in a manner to work on common coordinate locations of respective faces of said workpiece.

21. The apparatis of claim 20, which further includes a computer based device operably connected to said first working tool and said second working tool to aid in carrying out the work.

22. An apparatus for working on both sides of a flat workpiece, said apparatus comprising:
(a) a first support surface having a first axial line thereacross;
(b) a second support surface juxtaposed to and associated with said first support surface and having a second axial line thereacross which lies in a first common plane with said first axial line;
(c) a first carrying assembly operably connected to said first support surface in a manner to movably reciprocate along said first axial line, said first carrying assembly having a first extending arm which is laterally displaced from a first side of said first common plane and a second extending arm which is laterally displaced from a second side of said first common plane;
(d) a second carrying assembly operably connected to said second support surface in a manner to movably reciprocate along said second axial line, wherein said second carrying assembly includes means for removably mounting said workpiece in a manner to position said workpiece in said first common plane between said arms such that said arms extend about said workpiece;
(e) a first working tool removably operably connected to either of said extending arms in a manner to permit said first working tool to perform work on a face of said workpiece;
(f) a means to posture said apparatus such that said first common plane is maintained generally vertical to earth's horizon thereby facilitating access to either of said arms; and
(g) means for counterbalancing said second carrying assembly against gravitational force.

23. The apparatus of claim 22, wherein said first axial line and said second axial line are generally perpendicular to one another.

24. The apparatus of claim 22, wherein said first working tool connects to said first arm and said apparatus further including a first back-up tool connected to said second arm.

25. The apparatus of claim 24, wherein each said tool is configured with a tool connecting means for fixably connecting each said arm thereto.

26. The apparatus of claim 25, wherein said first working tool has a predefined tool axis and said tool connecting means maintains said predefined tool axis at a predetermined angle to said first common plane.

27. The apparatus of claim 26, wherein said tool connecting means maintains said predefined tool axis perpendicular to said first common plane.

28. The apparatus of claim 24, wherein said first backup tool includes means for performing at least one of supporting, preventing breakout, and sensing a position of said first working tool on said first carrying assembly.

29. The apparatus of claim 22, wherein each said arm is configured with an arm connecting means for fixably connecting said first working tool thereto.

30. The apparatus of claim 29, wherein said first working tool has a predefined tool axis and said arm connecting means maintains said first working tool at a predefined tool axis and said arm connecting means maintains said predefined tool axis at a predetermined angle to said first common plane.

31. The apparatus of claim 30, wherein said arm connecting means maintains said predefined tool axis perpendicular to said first common plane.

32. The apparatus of claim 22, which further includes a stabilizing member movably cooperatively connected to at least one of said arms.

33. The apparatus of claim 22, wherein said first working tool has a defined tool axis and each said arm includes a tool receiving surface capable of maintaining said first working tool at a predetermined angle and distance to said first common plane.

34. The apparatus of claim 22, which further includes a first actuating means operably connected to said first carrying assembly for causing said arms to traverse about said first common plane in unison according to one of automated and manual actuation and a second actuating means operably connected to said second carrying assembly for causing said second carrying assembly to move within said first common plane according to one of automated and manual actuation.

35. The apparatus of claim 34, wherein said actuation is automated and includes a computer based device connected to both said actuating means.

36. The apparatus of claim 22, wherein said first working tool includes means for performing at least one of drilling, milling, routing, drawing, sensing, scribing, and cutting said workpiece.

37. The apparatus of claim 22, wherein said first working tool has a predefined tool axis which is positioned substantially perpendicular to said first common plane.

38. The apparatus of claim 22, which further includes means connected to said first working tool for causing said first working tool to engage and disengage the said workpiece according to one of automated and manual actuation.

39. The apparatus of claim 22, wherein said first working tool is removably connectable to each said am to act on common coordinate locations of respective faces of said workpiece.

40. The apparatus of claim 22, wherein said first working tool is operably connected to said first extending arm in a manner to permit said first working tool to perform work on a first face of said workpiece and a first backup tool is operably connected to said second extending arm to aid the first working tool in performing work on the said first face, and wherein said first working tool and said first backup tool are connected to the arms in such a way that they can be disconnected and a second working tool can be subsequently operably connected to said second extending arm to perform work on a second face of said workpiece, and a second backup tool can be subsequently operably connected to said first extending arm to aid the second working tool in performing work on the second face.

41. The apparatus of claim 40, which further includes means operably connected to said first carrying assembly for causing said arms to traverse about said first common plane in unison according to one of automated and manual actuation.

42. The apparatus of claim 41, wherein said actuation is automated and includes a computer based device connected to said causing means.

43. The apparatus of claim 40, wherein said first working tool and said second working tool include means for performing at least one of drilling, milling, routing, drawing, sensing, scribing, and cutting said workpiece.

44. The apparatus of claim 40, wherein said first working tool and said second working tool include respective defined tool axes and said tool axes are positioned substantially perpendicular to said first common plane.

45. The apparatus of claim 40, which further includes means connected to said first working tool and said second working tool for causing said first working tool and said second working tool to engage and disengage said workpiece according to one of automated and manual actuation.

46. The apparatus of claim 45, wherein said actuation is automated and includes a computer based device.

47. The apparatus of claim 40, wherein said first working tool and said second working tool are operably connected in a manner to work on common coordinate locations of respective faces of the workpiece.

48. The apparatus of claim 40, wherein said first backup tool and said second backup tool include means for performing at least one of supporting, preventing breakout, and sensing a position of the associated working tool.

49. The apparatus of claim 40, which further includes a computer based device operably connected to said first working tool and said second working tool to aid in carrying out the work.

50. A method of working a generally flat workpiece from opposite sides, comprising the steps of:

(A) releasably disposing a pair of opposing workpiece faces to a first carriage member of a positioning means for relatively positioning a means for performing work on said workpiece and said workpiece such that a first substantially flat workpiece face is maintained, substantially parallel to and facing away from a first side of a predetermined plane and a second substantially flat workpiece face is substantially parallel to and facing away from a second side of said predetermined plane;

(B)(1) ensuring a working means for cutting the workpiece is releasably operably disposed to a second carriage member of said positioning means such that said working means can be located adjacent to either of said workpiece faces and (2) intermittently actuating said carriage members relative to a base member of said positioning means such that said working means traverses a first element set of predetermined coordinate elements within a predetermined coordinate area of said disposed faces while intermittently predeterminedly engaging said working means with said workpiece in a manner to effect a first hole set of one or more predetermined hole patterns through said disposed workpiece;

(C)(1) ensuring a first inscribing working means for inscribing the workpiece is releasably operably disposed to said second carriage member adjacent to said first face and (2) intermittently actuating said carriage members relative to said base member such that said first inscribing working means traverses a second element set of predetermined coordinate elements within said coordinate area of said faces while intermittently predeterminedly engaging said first inscribing working means with said workpiece in a manner to effect a first inscription set of one or more predetermined line patterns to said first face;

(D)(1) releasably, operably redisposing the first inscribing working means to a different position on said second carriage member, which position is adjacent to said second face, and (2) intermittently actuating said carriage members relative to said base member such that said redisposed first inscribing working means traverses a third element set of predetermined coordinate elements within said coordinate area of said second face while intermittently predeterminedly engaging said redisposed first inscribing working means with said workpiece in a manner to independently effect a second inscription set of one of more predetermined line patterns to said second face;

(E) automating said actuating and said engaging by means for automating including one of a programmed instruction set, a computing device, and a digital controller; and (F) lastly, releasing said workpiece faces from their said disposed positions; whereby: said second inscription set and said first inscription set may have differing patterns.

51. The method of claim 50, whereby both of said opposing faces of said workpiece can be completely worked without having to disturb mounting of said workpiece.

52. The method of claim 50, wherein said second carriage member includes a pair of opposing arms.

53. The method of claim 50, which further includes means for posturing and positioning such that said predetermined plane is maintained vertical to earth's horizon, thus facilitating access to either of said opposing faces and further includes counterbalancing said first carriage member against gravitational force.

54. The method of claim 50, wherein said working means for cutting includes tool means for performing one of drilling, boring, cutting, laser cutting, and routing whereas said inscribing working means includes one of milling, routing, drawing, scribing, and cutting.

55. A method of working a generally flat workpiece from opposite sides, comprising the steps of:

(A) releasably disposing a pair of opposing workpiece faces to a first carriage member of a positioning means for relatively positioning a means for performing work on said workpiece and said workpiece, wherein the pair of opposing workpiece faces are substantially parallel to one another and are offset from first and second sides of a predetermined plane;

(B)(1) providing a second carriage member moveably disposed on said positioning means, (2) posturing said positioning means such that said predetermined plane is maintained generally vertical to earth's horizon thereby facilitating access to either of said opposing workpiece faces; and (3) counterbalancing said first carriage member against gravitational force;

(C)(1) ensuring a first inscribing working means for inscribing the workpiece is releasably operably disposed to said second carriage member adjacent to a first of said opposing workpiece faces and (2) intermittently actuating said carriage members relative to a base member of said positioning means such that said first inscribing working means traverses a first element set of predetermined coordinate elements within a coordinate area of said faces while intermittently predeterminedly engaging said first inscribing working means with said workpiece in a manner to effect a first inscription set of one or more predetermined line patterns to said first face;

(D)(1) releasably operably redisposing the first inscribing working means to a different position on said second carriage member which position is adjacent to a second of said opposing workpiece faces, and (2) intermittently actuating said carriage members relative to said base member such that said redisposed first inscribing working means traverses a second element set of predetermined coordinate elements within said coordinate area of said second face while intermittently predeterminedly engaging said redisposed first inscribing working means with said workpiece in a manner to effect a second inscription set of one of more predetermined line patterns to said second face;

(E) automating said actuating and said engaging by means for automating including one of: a programmed instruction set, a computing device, and a digital controller; and (F) lastly, releasing said workpiece faces from their said disposed positions whereby:

said second inscription set and said first inscription set may have differing patterns.

56. The method of claim 55, whereby both of said opposing faces of said workpiece can be completely worked without having to disturb mounting of said workpiece.

57. The method of claim 55, wherein said second carriage member includes a pair of opposing arms, each of which has a means for mounting a working means thereto.

* * * * *